United States Patent
Umeda et al.

(10) Patent No.: US 11,451,211 B2
(45) Date of Patent: Sep. 20, 2022

(54) GALLIUM NITRIDE STRUCTURE, PIEZOELECTRIC ELEMENT, METHOD OF MANUFACTURING PIEZOELECTRIC ELEMENT, AND RESONATOR USING PIEZOELECTRIC ELEMENT

(71) Applicants: Murata Manufacturing Co., Ltd., Nagaokakyo (JP); National Institute of Advanced Industrial Science and Technology, Tokyo (JP)

(72) Inventors: Keiichi Umeda, Nagaokakyo (JP); Takaaki Mizuno, Nagaokakyo (JP); Yasuhiro Aida, Nagaokakyo (JP); Masato Uehara, Tosu (JP); Toshimi Nagase, Tosu (JP); Morito Akiyama, Tosu (JP)

(73) Assignees: MURATA MANUFACTURING CO., LTD., Nagaokakyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 947 days.

(21) Appl. No.: 16/126,248

(22) Filed: Sep. 10, 2018

(65) Prior Publication Data
US 2019/0007026 A1  Jan. 3, 2019

Related U.S. Application Data

(63) Continuation of application No. PCT/JP2017/009459, filed on Mar. 9, 2017.

(30) Foreign Application Priority Data

Mar. 11, 2016 (JP) .............................. JP2016-048236

(51) Int. Cl.
*H01L 41/047* (2006.01)
*H03H 9/17* (2006.01)
(Continued)

(52) U.S. Cl.
CPC ......... *H03H 9/176* (2013.01); *H01L 41/0477* (2013.01); *H01L 41/0805* (2013.01);
(Continued)

(58) Field of Classification Search
CPC ...... H03H 9/176; H03H 9/0595; H03H 9/131; H01L 41/0477; H01L 41/187
See application file for complete search history.

(56) References Cited

U.S. PATENT DOCUMENTS

2005/0093157 A1   5/2005 Noguchi et al.
2005/0248238 A1*  11/2005 Yamada ............. H03H 9/02102
                                                310/366
(Continued)

FOREIGN PATENT DOCUMENTS

JP   2004269313 A   9/2004
JP   2005136115 A   5/2005

OTHER PUBLICATIONS

International Search Report issued for PCT/JP2017/009459, dated May 30, 2017.
(Continued)

*Primary Examiner* — Bryan P Gordon
(74) *Attorney, Agent, or Firm* — ArentFox Schiff LLP (57) ABSTRACT

A gallium nitride structure that includes: a substrate; a gallium nitride layer opposed to the substrate and containing gallium nitride as a main component thereof; and a first electrode between the gallium nitride layer and the substrate. The first electrode includes at least one hafnium layer
(Continued)

containing a single metal of hafnium as a main component thereof, and the at least one hafnium layer is in contact with the gallium nitride layer.

19 Claims, 12 Drawing Sheets

(51) Int. Cl.
    *H01L 41/187*     (2006.01)
    *H01L 41/29*     (2013.01)
    *H01L 41/316*     (2013.01)
    *H01L 41/08*     (2006.01)
    *H03H 3/02*     (2006.01)
    *H03H 9/05*     (2006.01)
    *H03H 9/13*     (2006.01)
    *H03H 9/02*     (2006.01)
    *H03H 9/15*     (2006.01)

(52) U.S. Cl.
    CPC ............ *H01L 41/187* (2013.01); *H01L 41/29* (2013.01); *H01L 41/316* (2013.01); *H03H 3/02* (2013.01); *H03H 9/0595* (2013.01); *H03H 9/131* (2013.01); *H03H 2003/027* (2013.01); *H03H 2009/02488* (2013.01); *H03H 2009/155* (2013.01)

(56) References Cited

U.S. PATENT DOCUMENTS

| | | | | |
|---|---|---|---|---|
| 2011/0062826 | A1* | 3/2011 | Umeki | H03H 9/0595 310/344 |
| 2012/0286287 | A1* | 11/2012 | Lee | H01L 33/405 257/E33.025 |
| 2013/0193466 | A1* | 8/2013 | Sudhiranjan | H01L 33/025 438/46 |
| 2014/0363700 | A1* | 12/2014 | Tachibana | G11B 5/65 428/831 |
| 2015/0221774 | A1* | 8/2015 | Yamazaki | H01L 29/66969 257/43 |
| 2015/0326200 | A1* | 11/2015 | Grannen | H03H 9/02102 310/346 |

OTHER PUBLICATIONS

Written Opinion of the International Searching Authority issued for PCT/JP2017/009459, dated May 30, 2017.
Azadeh Ansari et al.; "GaN Micromechanical Resonators with Meshed Metal Bottom Electrode"; Materials 2015, vol. 8, pp. 1204-1212.

* cited by examiner

GALLIUM NITRIDE STRUCTURE, PIEZOELECTRIC ELEMENT, METHOD OF MANUFACTURING PIEZOELECTRIC ELEMENT, AND RESONATOR USING PIEZOELECTRIC ELEMENT

CROSS REFERENCE TO RELATED APPLICATIONS

The present application is a continuation of International application No. PCT/JP2017/009459, filed Mar. 9, 2017, which claims priority to Japanese Patent Application No. 2016-048236, filed Mar. 11, 2016, the entire contents of each of which are incorporated herein by reference.

FIELD OF THE INVENTION

The present invention relates to a gallium nitride structure, a piezoelectric element, a method of manufacturing a piezoelectric element, and a resonator using a piezoelectric element.

BACKGROUND OF THE INVENTION

GaN (gallium nitride) used as a material of an LED and the like is a piezoelectric body having an excellent quality factor. In general, methods such as MOVPE, MBE, and MPCVD are used for forming a GaN film. In such methods, the film formation temperature of the GaN film is 900° C. or more, and hence when the GaN film is used as a piezoelectric material, it is extremely difficult to form a lower electrode between a substrate and the GaN film.

Non-Patent Document 1 discloses a method of forming a lower electrode between a GaN film and a Si substrate. In Non-Patent Document 1, the GaN film is firstly formed on the Si substrate. Then, a hole is formed by removing a part of the GaN film through etching and the like, and the hole is then filled with W (tungsten), $SiO_2$ deposited on the filled W, and a GaN film is formed thereon again.

Non-Patent Document 1: Azadeh Ansari, Che-Yu Liu, Chien-Chung Lin, Hao-Chung Kuo, Pei-Cheng Ku and Mina Rais-Zadeh, "GaN Micromechanical Resonators with Meshed Metal Bottom Electrode", Materials 2015, 8, p 1204-1212.

SUMMARY OF THE INVENTION

The method disclosed in Non-Patent Document 1 uses MOCVD for the film formation of GaN, and the film formation temperature thereof is 1070° C., which is high. In addition, when a piezoelectric element is formed by the method disclosed in Non-Patent Document 1, the manufacturing process thereof becomes extremely complicated.

The present invention has been made in view of the situation above, and an object thereof is to provide a lower electrode that can be formed by an easy process in which the film formation temperature is 600° C. or less, for example, in a gallium nitride structure using GaN.

A gallium nitride structure according to an aspect of the present invention includes: a substrate; a gallium nitride layer opposed to the substrate and containing gallium nitride as a main component thereof; and a first electrode between the gallium nitride layer and the substrate, the first electrode including at least one hafnium layer containing a single metal of hafnium as a main component thereof, the at least one hafnium layer in contact with the gallium nitride layer.

According to the present invention, it is possible to provide a lower electrode that can be formed by an easy process in a gallium nitride structure using GaN.

DETAILED DESCRIPTION OF THE PREFERRED EMBODIMENTS

Embodiment 1

1. Configuration of Resonator

Figure 1:
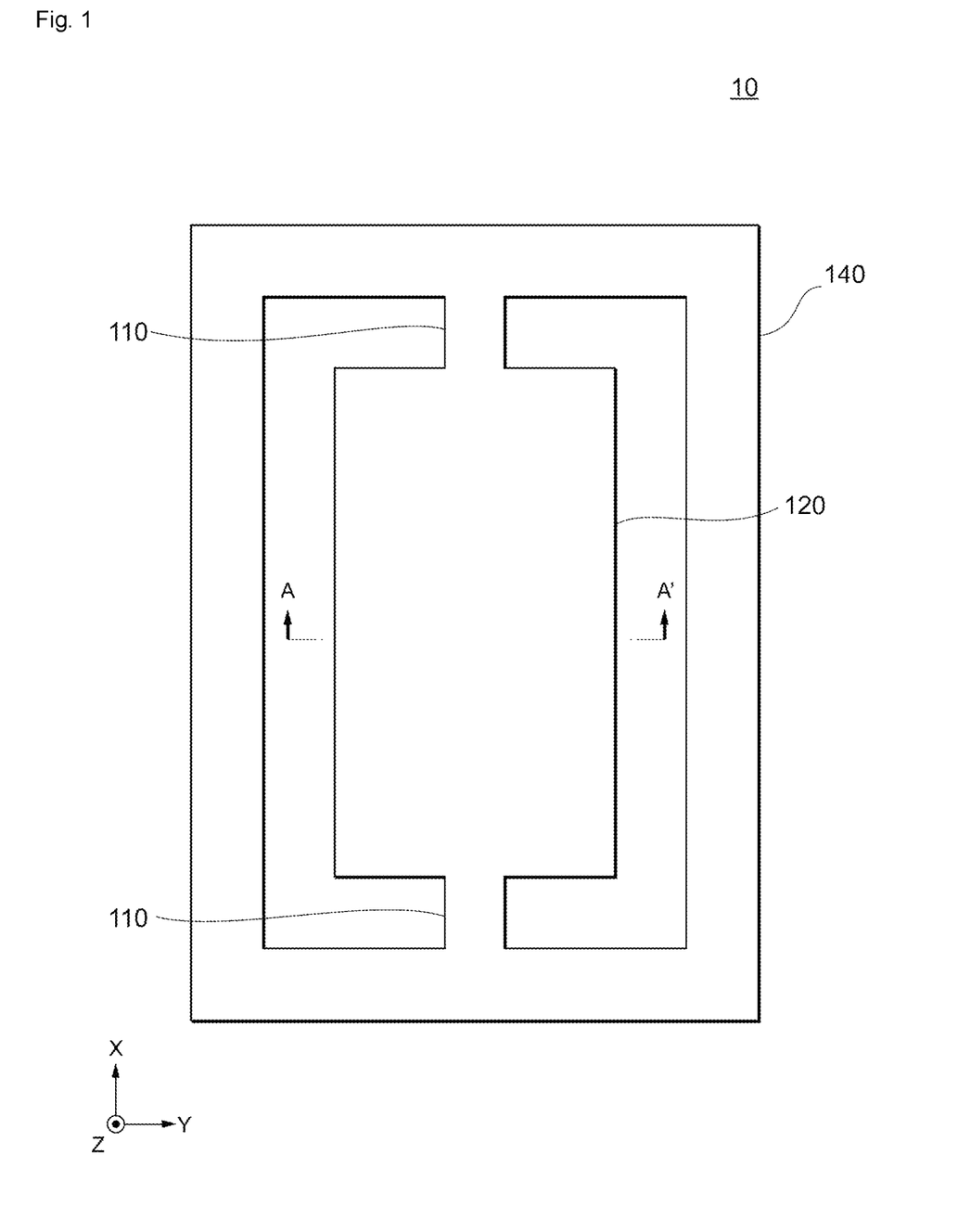
FIG. 1 is a plan view schematically illustrating a structure of a resonator according to a specific example.

Embodiment 1 of the present invention is described below with reference to the attached drawings. FIG. 1 is a plan view schematically illustrating an example of a resonator 10 formed with use of a piezoelectric element that is an example of a gallium nitride structure according to Embodiment 1 of the present invention. The resonator 10 is a MEMS vibrator manufactured with use of MEMS technology and performs in-plane vibration in an XY plane of a rectangular coordinate system in FIG. 1. The piezoelectric element according to the present invention is not limited to be used for a resonator using a thickness spreading vibration mode illustrated in FIG. 1, and may be used for a thickness vertical vibration mode, a Lamb wave vibration mode, a bending vibration mode, and a surface wave vibration mode. Those modes are applied to a timing device, an RF filter, a duplexer, and an ultrasonic transducer. Those modes may be used for a piezoelectric mirror or a piezoelectric gyro having an actuator function, a piezoelectric microphone or an ultrasonic vibration sensor having a pressure sensor function, and the like.

As illustrated in FIG. 1, the resonator 10 includes a vibration portion 120 (an example of a piezoelectric element), a holding portion 140, and holding arms 110.

The vibration portion 120 has a plate-shaped contour spreading in a planar form along the XY plane. The vibration portion 120 is provided on the inside of the holding portion 140, and spaces are formed between the vibration portion 120 and the holding portion 140 at predetermined intervals.

The holding portion 140 is formed as a rectangular frame shape so as to surround the outside of the vibration portion 120 along the XY plane. For example, the holding portion 140 is integrally formed with a prismatic frame body. It is sufficient that the holding portion 140 be provided on at least a part of the periphery of the vibration portion 120, and the holding portion 140 is not limited to a frame shape.

The holding arms 110 are provided on the inside of the holding portion 140 and connect the vibration portion 120 and the holding portion 140 to each other.

2. Layered Structure of Vibration Portion

Figure 2:
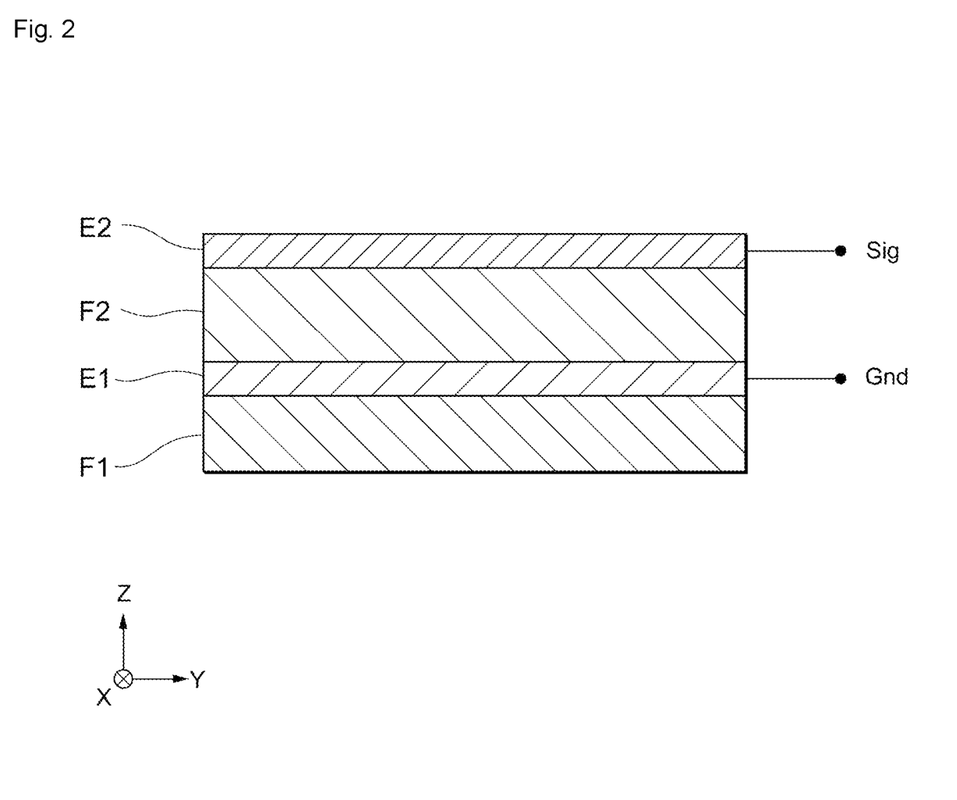
FIG. 2 is a schematic diagram of a cross section taken along line AA' in FIG. 1.

Next, a laminated structure of the vibration portion 120 according to this embodiment is described with reference to FIG. 2. FIG. 2 is a cross section diagram taken along line AA' in FIG. 1.

In this embodiment, the vibration portion 120 is formed by laminating a lower electrode E1 (an example of a first electrode and a hafnium layer) on a substrate F1. A piezoelectric thin film F2 (an example of a gallium nitride layer and a piezoelectric body layer) is laminated on the lower electrode E1 so as to cover the lower electrode E1. An upper electrode E2 (an example of a second electrode) is laminated on the piezoelectric thin film F2.

The substrate F1 is formed from a degenerated n-type Si (silicon) semiconductor having a thickness of about 10 μm, for example. The substrate F1 can include P (phosphorus), As (arsenic), and Sb (antimony) as an n-type dopant. It is preferred that the substrate F1 be a substrate containing degenerated Si as a main component, but the substrate F1 is not limited thereto. For example, the substrate F1 may be formed from single crystals such as non-degenerate Si or sapphire or may be formed from amorphous materials such as glass or Si having an oxide film.

The lower electrode E1 is formed from a hafnium layer containing a single metal of Hf (hafnium) as a main component thereof. The hafnium layer has a surface in contact with the substrate F1 and a surface in contact with the piezoelectric thin film F2.

The upper electrode E2 is formed with use of Mo (molybdenum), Al (aluminum), Au (gold), W (tungsten), and Pt (platinum), for example.

The piezoelectric thin film F2 contains GaN (gallium nitride) as a main component thereof and is a thin film that is a piezoelectric body that converts applied voltage into vibration. The piezoelectric thin film F2 expands and contracts in an in-plane direction of the XY plane in accordance with an electric field applied to the piezoelectric thin film F2 by the lower electrode E1 and the upper electrode E2. By the expansion and contraction of the piezoelectric thin film F2, the vibration portion 120 performs contour vibration in a Y-axis direction.

The laminated structure illustrated in FIG. 2 may be used in a semiconductor device. The laminated structure may be used in semiconductor devices such as a transistor or a light emitting element so that the piezoelectric thin film F2 in FIG. 2 is used as a semiconductor layer and the lower electrode E1 is used as an electrode or a wiring layer connected to the semiconductor layer, for example.

3. Film Formation Method

Next, a film formation method of the lower electrode E1 and the piezoelectric thin film F2 out of the vibration portion 120 are described according to this embodiment.

In this embodiment, the lower electrode E1 and the piezoelectric thin film F2 are formed by sputtering. First, the lower electrode E1 is formed by performing sputtering on the substrate F1 in accordance with the conditions described below.

| Target | a single metal of Hf |
|---|---|
| Pressure | 0.25 Pa |
| Temperature | 400° C. |
| Output | 180 W |
| Time | 0.25 hours |

Next, the piezoelectric thin film F2 is formed by performing sputtering on the formed lower electrode E1 in accordance with the conditions described below.

| Target | GaN sintering |
|---|---|
| Pressure | 0.25 Pa |
| Temperature | 500° C. |
| Nitrogen concentration | 50% (Ar:$N_2$ = 1:1) |
| Output | 100 W |
| Time | 3 hours |

After the upper electrode E2 is formed on the piezoelectric thin film F2, the upper electrode E2 is processed into a desired shape through etching and the like.

As described above, the vibration portion 120 according to this embodiment forms the lower electrode E1 and the piezoelectric thin film F2 through sputtering. As a result, a GaN film can be formed at a low temperature, and hence the lower electrode E1 can be formed by a simple apparatus or process.

4. Comparative Example

With reference to FIG. 3, verification results of the orientation of the piezoelectric thin film F2 formed on the lower electrode E1 according to this embodiment and the orientation of a GaN film formed on a lower electrode of a comparative example obtained by performing X-ray diffraction is described. The lower electrode of the comparative example was formed with use of Ti (titanium), TiN (titanium nitride), and HfN (hafnium nitride). In FIGS. 3A to 3D, the horizontal axis indicates the angle of an incident wave with respect to a reflective surface, and the vertical axis indicates the intensity of a reflected wave.

Figure 3A:
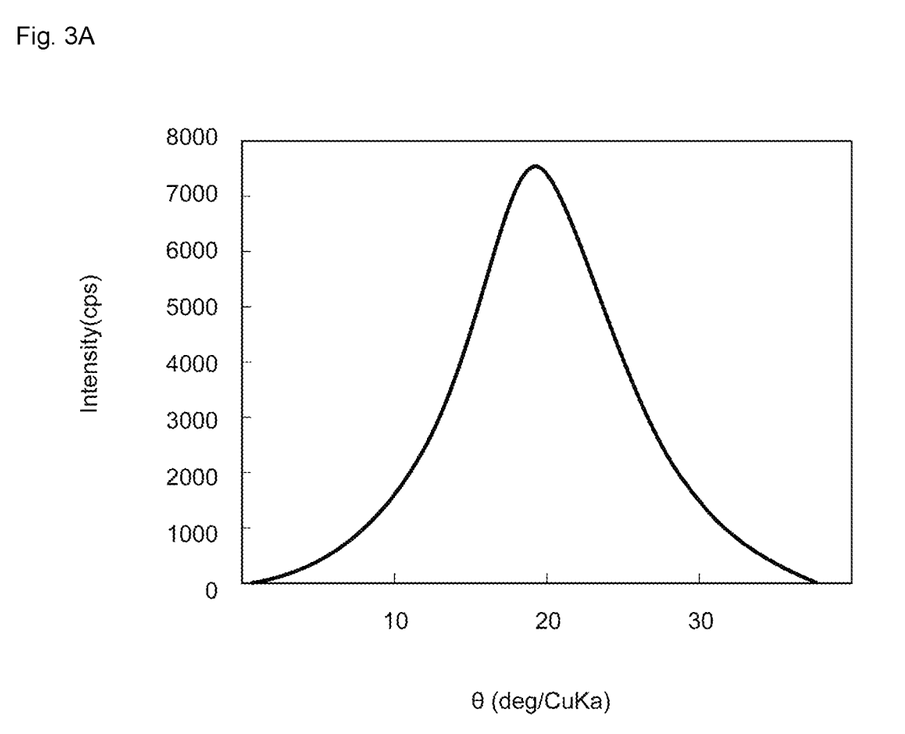
FIG. 3A is a graph illustrating a verification result of crystallinity obtained by performing rocking curve measurement for a GaN film of a comparative example and a piezoelectric thin film according to Embodiment 1 of the present invention.
Figure 3B:
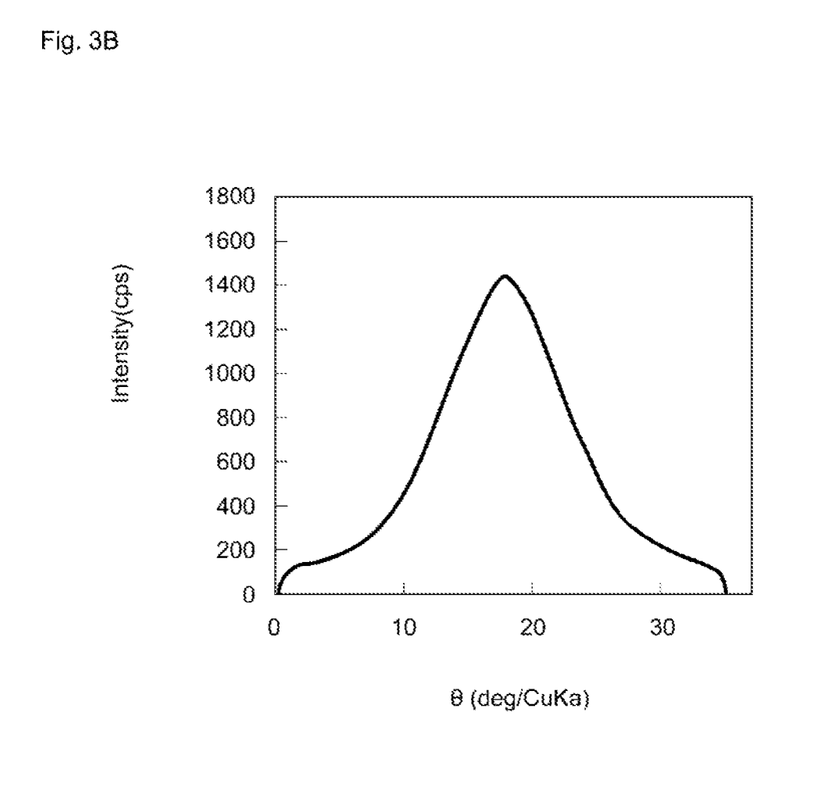
FIG. 3B is a graph illustrating a verification result of crystallinity obtained by performing rocking curve measurement for the GaN film of the comparative example and the piezoelectric thin film according to Embodiment 1 of the present invention.
Figure 3C:
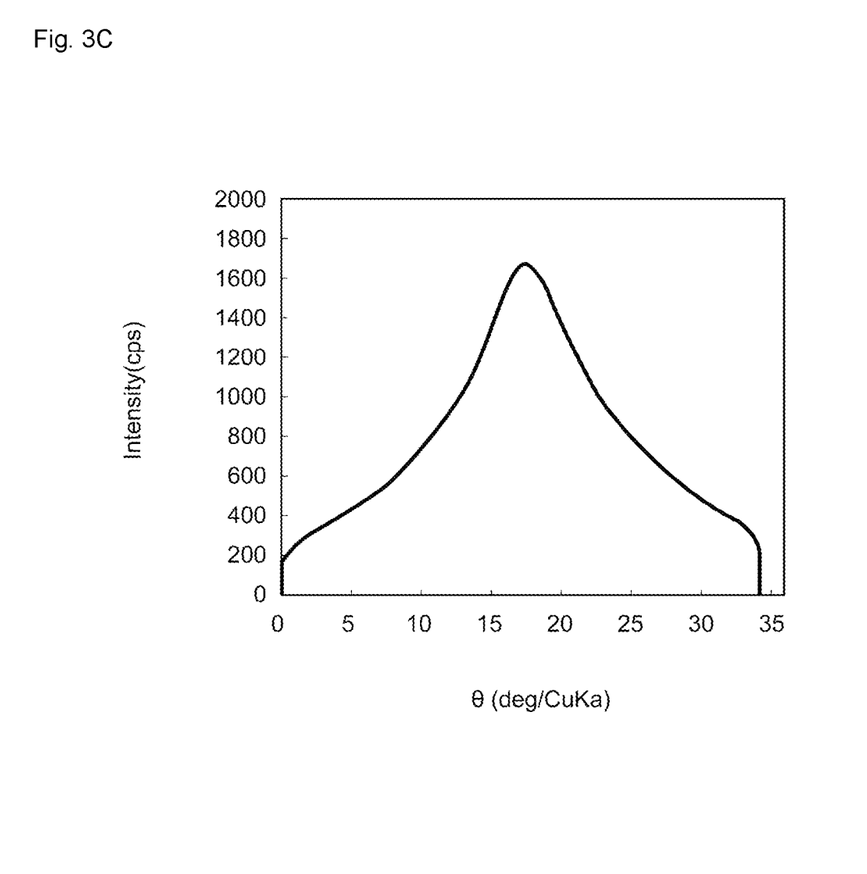
FIG. 3C is a graph illustrating a verification result of crystallinity obtained by performing rocking curve measurement for the GaN film of the comparative example and the piezoelectric thin film according to Embodiment 1 of the present invention.

FIG. 3A is a graph illustrating a result of rocking curve measurement performed on the GaN film formed on the lower electrode formed with use of Ti. In the same manner, FIG. 3B illustrates a result of rocking curve measurement when TiN is used in the lower electrode, and FIG. 3C illustrates a result of rocking curve measurement when HfN is used in the lower electrode. As evidenced by FIGS. 3A to 3C, the half width of the rocking curve was 10 degrees or more for all cases.

Figure 3D:
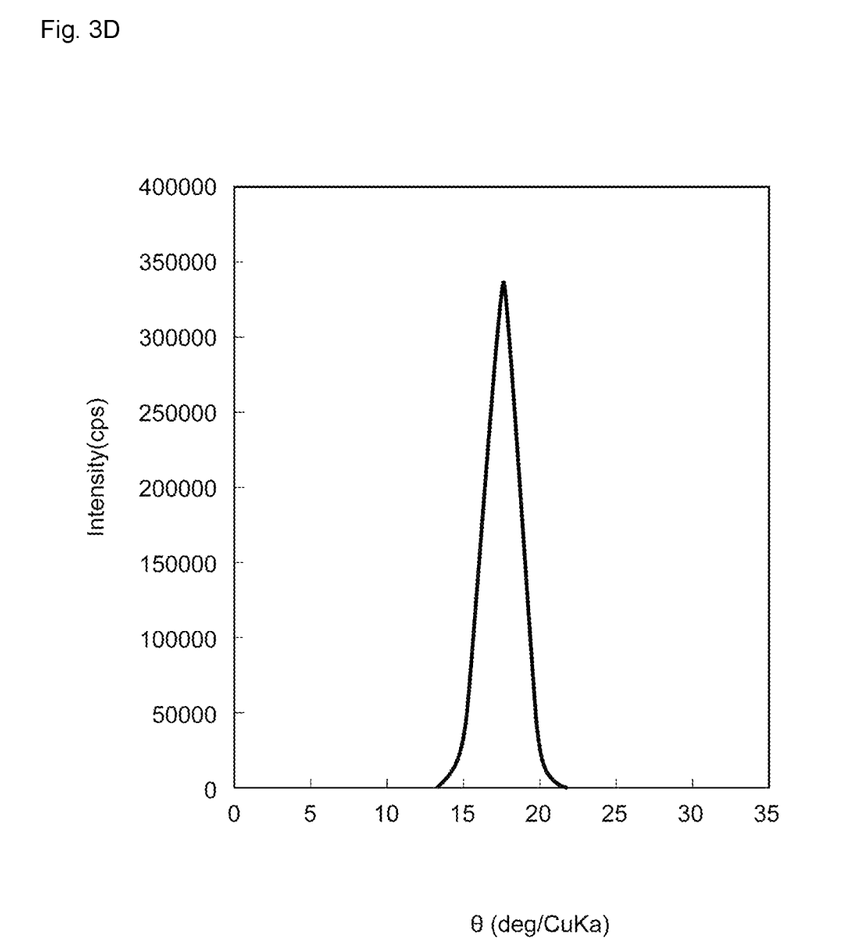
FIG. 3D is a graph illustrating a verification result of crystallinity obtained by performing rocking curve measurement for the GaN film of the comparative example and the piezoelectric thin film according to Embodiment 1 of the present invention.

Meanwhile, FIG. 3D illustrates a result of rocking curve measurement performed on the piezoelectric thin film F2 according to this embodiment. In that case, the half width of the rocking curve of Hf (002) was about 2 degrees. As described above, according to this embodiment, the crystallinity of the piezoelectric thin film F2 formed on the lower electrode E1 and containing GaN as a main component was able to be enhanced by using Hf as the lower electrode E1. Note that Hf had a hexagonal structure and the peak of Hf (002) was intensely observed by XRD (X-ray diffraction).

Figure 4A:
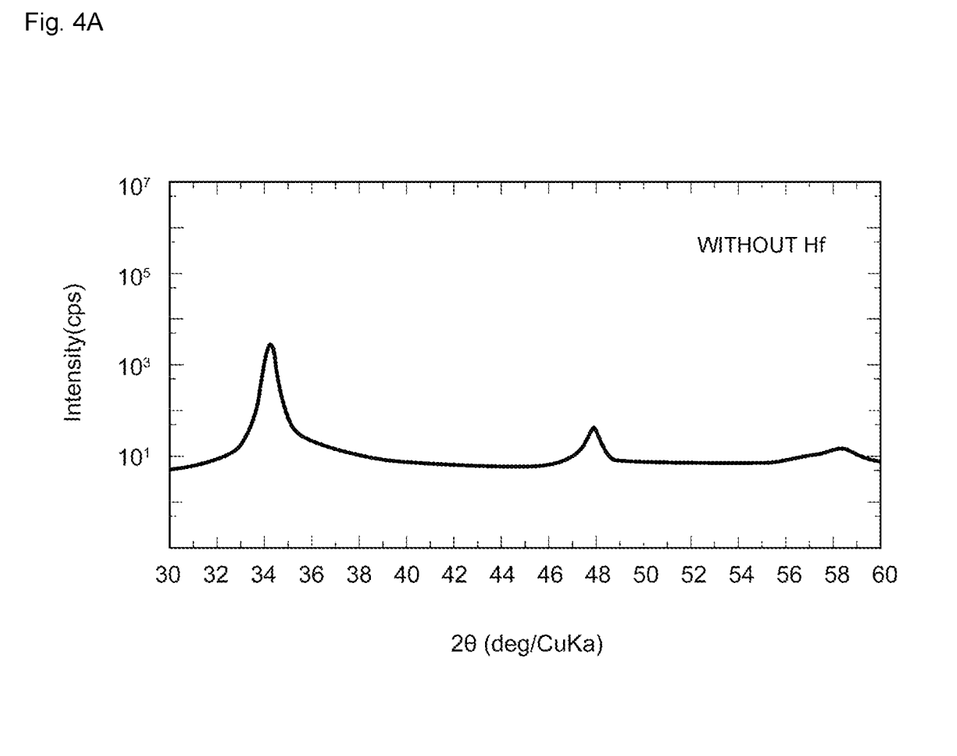
FIG. 4A is a graph illustrating a verification result of crystallinity obtained by performing X-ray diffraction for the GaN film of the comparative example and the piezoelectric thin film according to Embodiment 1 of the present invention.
Figure 4B:
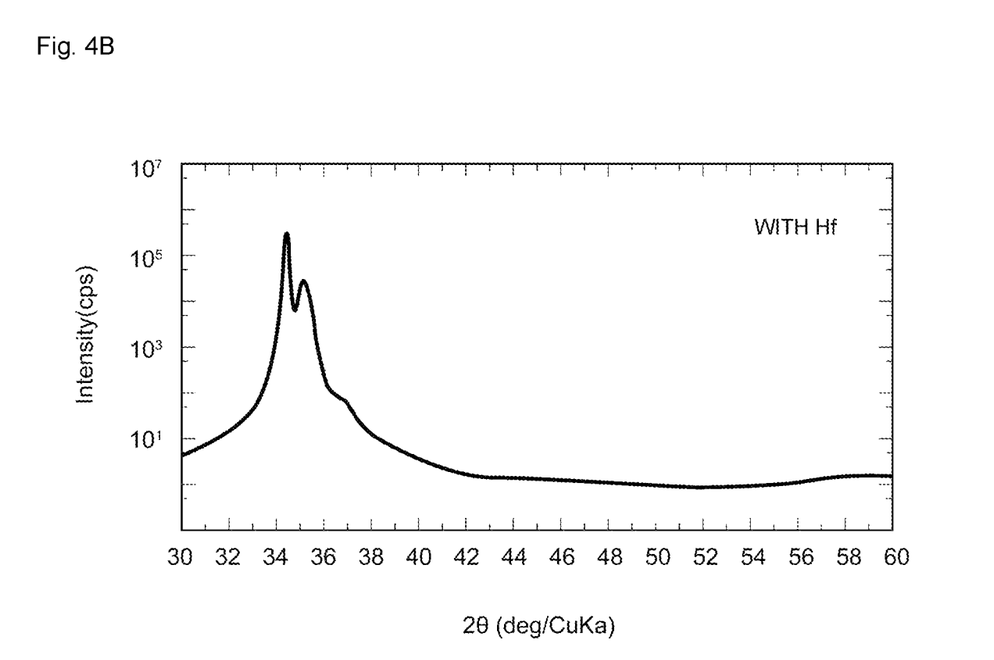
FIG. 4B is a graph illustrating a verification result of crystallinity obtained by performing X-ray diffraction for the GaN film of the comparative example and the piezoelectric thin film according to Embodiment 1 of the present invention.

Next, with reference to FIG. 4, a verification result of an effect obtained by including the lower electrode E1 containing Hf as a main component in in the vibration portion 120 is described.

FIG. 4A is a graph illustrating a result of X-ray diffraction performed on the GaN film of the comparative example directly formed on the substrate without forming the lower electrode E1. FIG. 4B is a graph illustrating a result of X-ray diffraction performed on the piezoelectric thin film F2 according to this embodiment. In FIGS. 4A and 4B, the horizontal axis indicates the angle of a reflected wave with respect to an incident wave, and the vertical axis indicates the intensity of the reflected wave.

As evidenced by FIGS. 4A and 4B, the maximum intensity of the diffraction peak of the GaN film of the comparative example, that is, the GaN film that does not include the lower electrode was 1129 cps, while the maximum intensity of the diffraction peak of the piezoelectric thin film F2 according to this embodiment was 276396 cps. Therefore, it can be seen from the graph of FIG. 4 that the crystallinity of the piezoelectric thin film F2 was enhanced because the intensity of the diffraction peak has increased as a result of the vibration portion 120 according to this embodiment including the lower electrode E1 containing Hf as a main component.

In the GaN film of the comparative example, a half width of GaN (002) obtained by the rocking curve measurement was 10.55 degrees and an average value of piezoelectric constants was 0.83 pc/N. Meanwhile, in the piezoelectric thin film F2 according to this embodiment, a half width obtained by the rocking curve measurement was about 2 degrees and an average value of piezoelectric constants was 3.18 pc/N. Note that GaN had a wurtzite-type structure and the peak of GaN (002) was intensely observed by XRD.

It was understood from the abovementioned results that excellent crystallinity and an excellent piezoelectric constant can be obtained for the vibration portion 120 according to this embodiment by forming the piezoelectric thin film F2 containing GaN as a main component on the lower electrode E1 containing Hf as a main component.

Embodiment 2

Embodiment 2 and descriptions thereafter omit the description of matters overlapping with those in Embodiment 1 and describe only the different matters. In particular, the same operation and effect by the same configuration are not described for every embodiment one after another.

Figure 5:
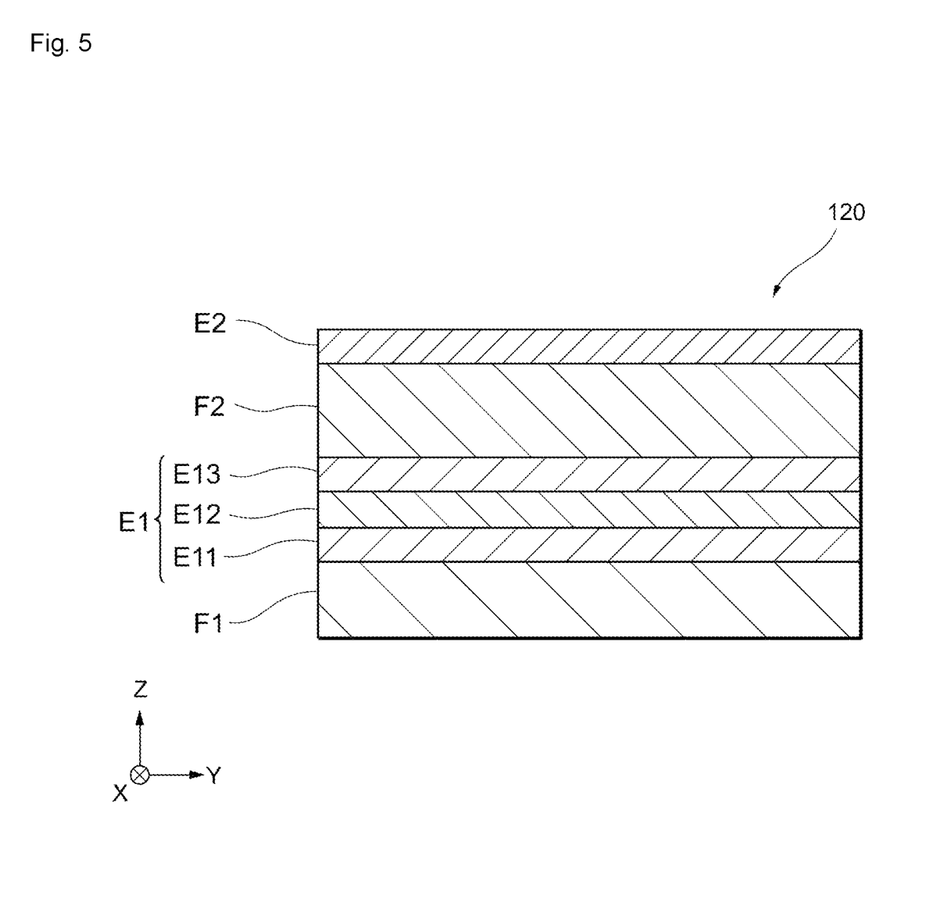
FIG. 5 is a schematic diagram corresponding to FIG. 2 and illustrating a laminated structure of a vibration portion according to Embodiment 2 of the present invention.

FIG. 5 is a view illustrating a laminated structure of the vibration portion 120 according to this embodiment. The lower electrode E1 according to this embodiment includes a first layer E11 (an example of a first hafnium layer) containing a single metal of Hf as a main component and having a surface in contact with the substrate F1, a second layer E13 (an example of a second hafnium layer) containing a single metal of Hf as a main component and having a surface in contact with the piezoelectric thin film F2, and an intermediate layer E12 (an example of an aluminum layer) formed between the first layer and the second layer. It is preferred that the intermediate layer E12 be a layer containing Al (aluminum) as a main component. However, the intermediate layer E12 is not limited thereto, and may be a metal layer having a resistivity lower than Hf such as an AlCu (aluminum-copper) alloy or Cu (copper).

It is preferred that the first layer E11, the second layer E13, and the intermediate layer E12 be all formed by sputtering. The film formation conditions for the sputtering for the first layer E11 and the second layer E13 are the same as the film formation conditions for the lower electrode E1 in Embodiment 1. As other film formation methods, the film may be formed by vapor deposition.

The vibration portion 120 according to this embodiment can lower the resistance value thereof by including the intermediate layer E12 in the lower electrode E1. Therefore, a low-loss piezoelectric resonator can be manufactured by using the vibration portion 120 according to this embodiment.

Figure 6A:
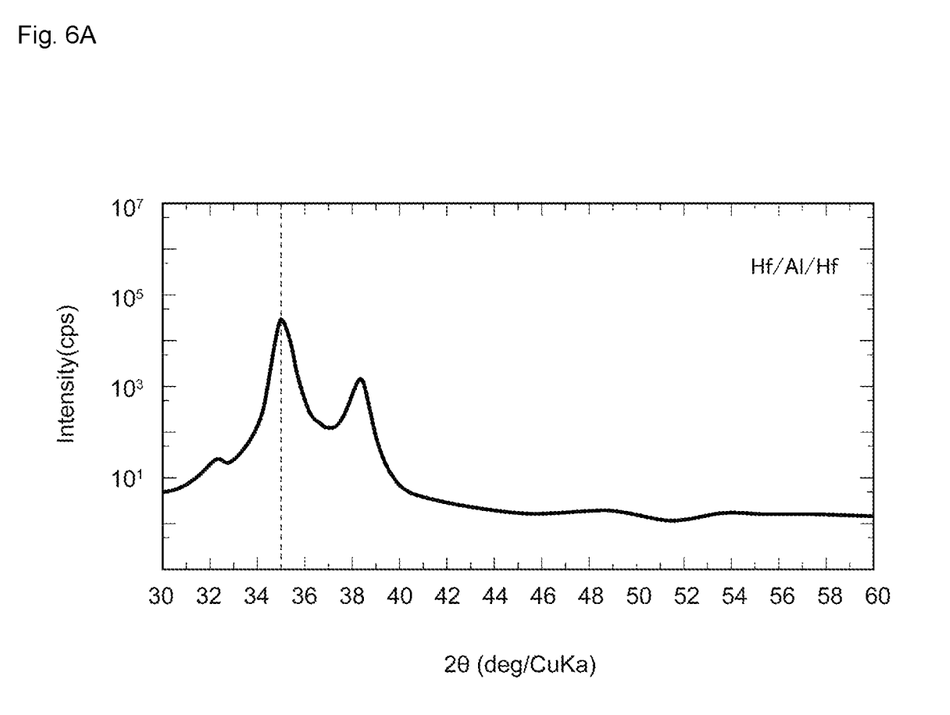
FIG. 6A is a graph illustrating a verification result of crystallinity obtained by performing X-ray diffraction for the GaN film of the comparative example, the piezoelectric thin film according to Embodiment 1 of the present invention, and a piezoelectric thin film according to Embodiment 2 of the present invention.
Figure 6B:
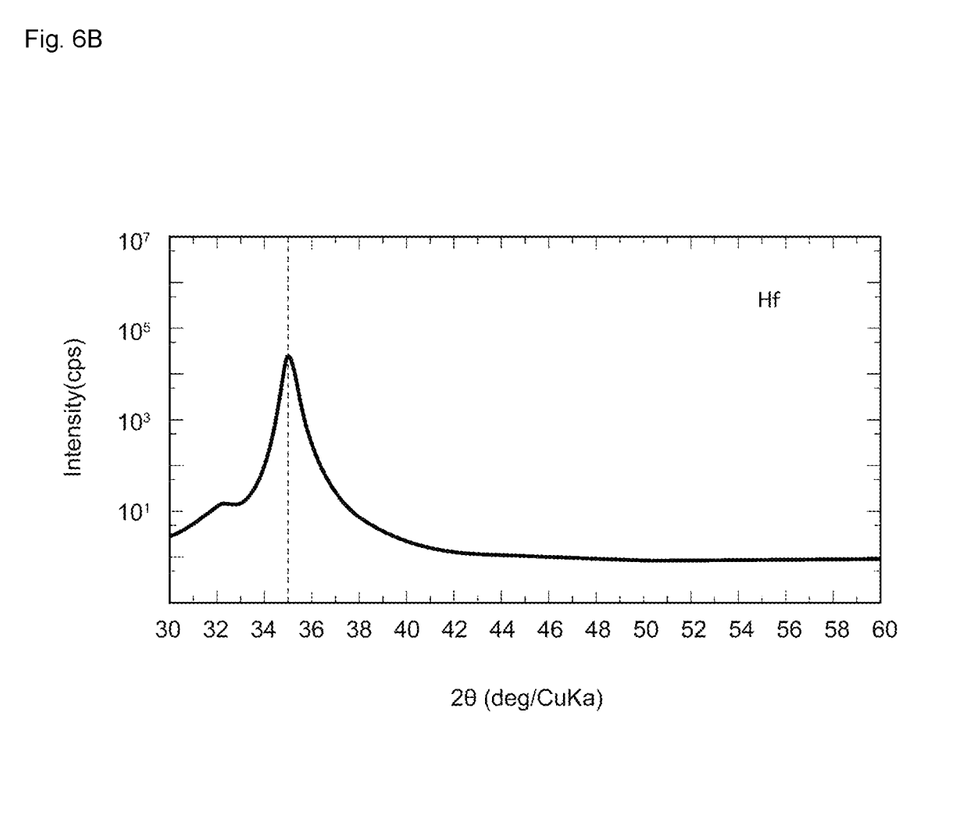
FIG. 6B is a graph illustrating a verification result of crystallinity obtained by performing X-ray diffraction for the GaN film of the comparative example, the piezoelectric thin film according to Embodiment 1 of the present invention, and the piezoelectric thin film according to Embodiment 2 of the present invention.
Figure 6C:
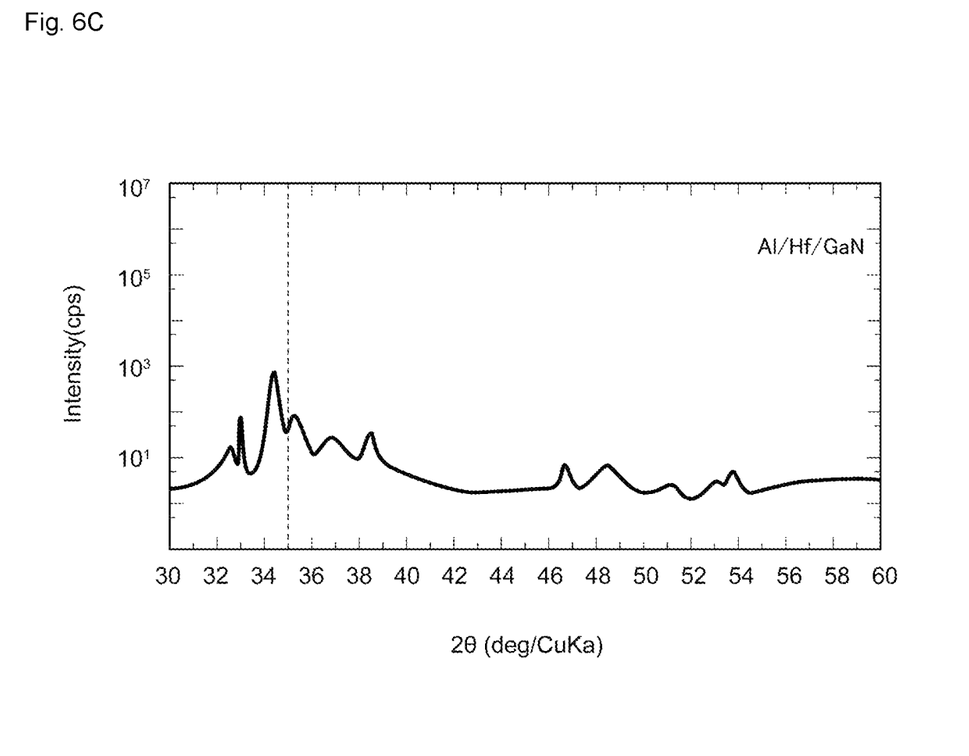
FIG. 6C is a graph illustrating a verification result of crystallinity obtained by performing X-ray diffraction for the GaN film of the comparative example, the piezoelectric thin film according to Embodiment 1 of the present invention, and the piezoelectric thin film according to Embodiment 2 of the present invention.

Next, with reference to FIG. 6, the influence on the crystallinity of the piezoelectric thin film F2 caused by the intermediate layer E12 being included the vibration portion 120 according to this embodiment is described. FIG. 6A is a graph illustrating a result of X-ray diffraction performed on the piezoelectric thin film F2 according to this embodiment. FIG. 6B is a graph illustrating a result of X-ray diffraction performed on the piezoelectric thin film F2 according to Embodiment 1. FIG. 6C is a graph illustrating a result of X-ray diffraction performed on a GaN film having a configuration in which the vibration portion 120 does not include the first layer E11 as a comparative example. In FIGS. 6A to 6C, the horizontal axis indicates the angle of a reflected wave with respect to the incident wave and the vertical axis indicates the intensity of the reflected wave.

As evidenced by the results in FIGS. 6A and 6B, the maximum intensity at the diffraction peak is about $10^5$ cps for both of the piezoelectric thin film F2 according to this embodiment and the piezoelectric thin film F2 according to Embodiment 1. As a result, it can be said that there is hardly any influence on the crystallinity of the piezoelectric thin film F2 even when the vibration portion 120 includes the intermediate layer E12.

Meanwhile, with respect to the result of FIG. 6C, the maximum intensity at the diffraction peak decreases to about $10^3$ cps as a result of not including the first layer E11 and directly forming the intermediate layer E12 on the substrate F1 in the GaN film of the comparative example. This is thought to happen because the orientation of the intermediate layer E12 is deteriorated when the intermediate layer E12 is directly formed on the substrate F1, and the orientation of the second layer E13 and the GaN film formed on the intermediate layer E12 is deteriorated as a result.

As described above, the vibration portion 120 according to this embodiment can lower the resistance value of the lower electrode E1 without degrading the crystallinity of the piezoelectric thin film F2 by including the intermediate layer E12 between the first layer E11 and the second layer E13 containing Hf.

Exemplary embodiments of the present invention have been described above. The vibration portion 120 according to one embodiment of the present invention includes: the substrate F1; the piezoelectric thin film F2 provided so as to be opposed to the substrate F1 and containing gallium nitride as a main component; and the lower electrode E1 that is provided between the piezoelectric thin film F2 and the substrate F1, includes at least one hafnium layer containing a single metal of hafnium as a main component, and is in contact with the piezoelectric thin film F2 in the at least one hafnium layer. As a result, the vibration portion 120 according to one embodiment of the present invention can be formed by a simple process with use of sputtering. It is thought that the vibration portion 120 is able to obtain excellent crystallinity and piezoelectricity mainly because the lattices of Hf and GaN match well with each other. As illustrated in FIG. 3, Hf is the most excellent even when compared with films containing, as a main component, TiN, Ti, or HfN of which degree of mismatching of the lattices is small as Hf. The nearest neighbor atom distance is 3.2 Å for GaN, 3.0 Å for TiN, 3.0 Å for Ti, 3.2 Å for HfN, and 3.2 Å for Hf.

It is preferred that the abovementioned at least one hafnium layer include the first layer E11 having a surface in contact with the substrate F1 and the second layer E13 having a surface in contact with the piezoelectric thin film F2, and the lower electrode E1 further include the intermediate layer E12 provided between the first layer E11 and the second layer E13 and containing aluminum as a main component. The vibration portion 120 can lower the resistance value thereof as a result of including the intermediate layer E12 in the lower electrode E1.

It is preferred that the vibration portion 120 further include the upper electrode E2 provided so as to be opposed to the lower electrode E1 across the piezoelectric thin film F2.

The resonator 10 according to one embodiment of the present invention can be formed by a simple process with use of sputtering as a result of including the abovementioned vibration portion 120.

A method of manufacturing the piezoelectric element according to one embodiment of the present invention includes forming the lower electrode E1 including a hafnium layer containing hafnium as a main component on the substrate F1 by sputtering, and forming the piezoelectric thin film F2 containing gallium nitride as a main component on the lower electrode E1 by sputtering. As a result, the piezoelectric thin film F2 including GaN as a main component can be formed at a low temperature, and the lower electrode E1 can be formed by a simple apparatus or process.

The above-mentioned embodiments are merely examples for facilitating an understanding of the present invention and does not serve to limit an interpretation of the present invention. The present invention may be changed/modified without departing from the gist of the invention, and the present invention includes equivalents thereof. That is, embodiments of which designs are changed by a person skilled in the art as appropriate are encompassed in the scope of the present invention as long as the features of the present invention are included. For example, the components and the arrangements thereof, the materials, the conditions, the shapes, the sizes, and the like included in the embodiments are not limited to those exemplified and can be changed as appropriate. It goes without saying that the embodiments are examples and partial replacement or combination of the configurations described in different embodiments is possible, and the replacement or combination is also encompassed in the scope of the present invention as long as the features of the present invention are included.

REFERENCE SIGNS LIST

10 Resonator
120 Vibration portion
F1 Substrate
F2 Piezoelectric thin film
E1 Lower electrode
E1 First layer
E12 Intermediate layer
E13 Second layer
E2 Upper electrode

What is claimed is:

1. A gallium nitride structure, comprising:
a substrate;
a gallium nitride layer provided so as to be opposed to the substrate and containing gallium nitride as a main component; and
a first electrode that is provided between the gallium nitride layer and the substrate, the first electrode including at least one hafnium layer containing a single metal of hafnium as a main component thereof, and the at least one hafnium layer in contact with the gallium nitride layer.

2. A gallium nitride structure, comprising:
a substrate;
a gallium nitride layer provided so as to be opposed to the substrate and containing gallium nitride as a main component; and
a first electrode that is provided between the gallium nitride layer and the substrate, the first electrode including at least one hafnium layer containing hafnium as a main component thereof the at least one hafnium layer in contact with the gallium nitride layer,
wherein the at least one hafnium layer includes:
a first hafnium layer that is in contact with the substrate;
a second hafnium layer that is in contact with the gallium nitride layer; and
a metal layer having a resistivity lower than hafnium between the first hafnium layer and the second hafnium layer.

3. The gallium nitride structure according to claim 2, wherein the metal layer is an aluminum layer containing aluminum as a main component thereof.

4. The gallium nitride structure according to claim 2, further comprising a second electrode opposed to the first electrode with the gallium nitride layer therebetween.

5. The gallium nitride structure according to claim 1, further comprising a second electrode opposed to the first electrode with the gallium nitride layer therebetween.

6. The gallium nitride structure according to claim 1, wherein the substrate comprises a degenerated n-type Si.

7. A resonator comprising:
a vibration portion comprising the gallium nitride structure according to claim 1;
a holding portion surrounding the vibration portion; and
a holding arm connecting the vibration portion to the holding portion.

8. A resonator comprising:
a vibration portion comprising the gallium nitride structure according to claim 2;
a holding portion surrounding the vibration portion; and
a holding arm connecting the vibration portion to the holding portion.

9. The resonator according to claim 8, wherein the metal layer is an aluminum layer containing aluminum as a main component thereof.

10. The resonator according to claim 8, further comprising a second electrode opposed to the first electrode with the gallium nitride layer therebetween.

11. The resonator according to claim 7, further comprising a second electrode opposed to the first electrode with the gallium nitride layer therebetween.

12. The resonator according to claim 7, wherein the substrate comprises a degenerated n-type Si.

13. A method of manufacturing a piezoelectric element, the method comprising:
forming a first electrode including a hafnium layer containing a single metal of hafnium as a main component thereof on a substrate by sputtering; and
forming a piezoelectric body layer containing gallium nitride as a main component thereof on the first electrode by sputtering.

14. The method of manufacturing a piezoelectric element according to claim 13, wherein the piezoelectric body layer is formed at a temperature of 500° C.

15. The method of manufacturing a piezoelectric element according to claim 13, wherein the forming of the first electrode includes:
forming a first hafnium layer on the substrate;
forming a metal layer having a resistivity lower than hafnium on the first hafnium layer; and
forming a second hafnium layer on the metal layer.

16. The method of manufacturing a piezoelectric element according to claim 15, wherein the metal layer is an aluminum layer containing aluminum as a main component thereof.

17. The method of manufacturing a piezoelectric element according to claim 15, further comprising forming a second electrode on the piezoelectric body layer.

18. The method of manufacturing a piezoelectric element according to claim 13, further comprising forming a second electrode on the piezoelectric body layer.

19. The method of manufacturing a piezoelectric element according to claim 13, wherein the substrate comprises a degenerated n-type Si.

* * * * *